United States Patent
Chon

(10) Patent No.: US 10,359,482 B2
(45) Date of Patent: Jul. 23, 2019

(54) METHOD AND APPARATUS FOR ACQUIRING IMAGE IN MAGNETIC RESONANCE IMAGING SYSTEM

(71) Applicant: SAMSUNG ELECTRONICS CO., LTD., Suwon-si (KR)

(72) Inventor: Hak-soo Chon, Seosan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1126 days.

(21) Appl. No.: 13/858,226

(22) Filed: Apr. 8, 2013

(65) Prior Publication Data
US 2014/0159719 A1 Jun. 12, 2014

(30) Foreign Application Priority Data
Dec. 6, 2012 (KR) .................. 10-2012-0141165

(51) Int. Cl.
 *G01R 33/36* (2006.01)
 *G01R 33/3415* (2006.01)
(52) U.S. Cl.
 CPC ..... *G01R 33/3628* (2013.01); *G01R 33/3415* (2013.01); *G01R 33/3664* (2013.01)
(58) Field of Classification Search
 USPC .................. 324/300–322; 600/407–435; 382/128–131
 See application file for complete search history.

(56) References Cited

U.S. PATENT DOCUMENTS

| | | | | | |
|---|---|---|---|---|---|
| 2,960,650 | A | * | 11/1960 | Pinkley | G01R 33/46 324/314 |
| 3,039,049 | A | * | 6/1962 | Pinkley | G01R 33/46 324/313 |
| 6,724,923 | B2 | * | 4/2004 | Ma | G01R 33/3415 382/131 |
| 6,738,501 | B2 | * | 5/2004 | Ma | G01R 33/3415 324/309 |
| 6,798,206 | B2 | * | 9/2004 | Misic | G01R 33/3415 324/318 |
| 6,833,705 | B2 | * | 12/2004 | Misic | G01R 33/3415 324/318 |

(Continued)

FOREIGN PATENT DOCUMENTS

| | | |
|---|---|---|
| CN | 101478067 A | 7/2009 |
| CN | 101869478 A | 10/2010 |

(Continued)

OTHER PUBLICATIONS

Communication dated Dec. 23, 2013 issued by the Korean Intellectual Property Office in counterpart Korean Patent Application No. 10-2012-0141165.

(Continued)

*Primary Examiner* — Melissa J Koval
*Assistant Examiner* — Tiffany A Fetzner
(74) *Attorney, Agent, or Firm* — Sughrue Mion, PLLC

(57) ABSTRACT

A method of acquiring an image in an MRI system includes dividing a scannable region of an object into regions, determining a coil to be used for the divided regions, receiving signals from the determined coil via signal channels connected to the determined coil and grouped by using a switching device, and acquiring the image from the received signals.

17 Claims, 10 Drawing Sheets

(56) References Cited

U.S. PATENT DOCUMENTS

| | | | |
|---|---|---|---|
| 6,961,455 B2* | 11/2005 | Ma | G01R 33/3415 324/309 |
| 6,990,223 B2* | 1/2006 | Ma | G01R 33/3415 324/309 |
| 7,508,214 B2* | 3/2009 | Misic | G01R 33/3415 324/318 |
| 7,834,624 B2* | 11/2010 | Arnold | A61B 5/0555 324/307 |
| 7,868,614 B2* | 1/2011 | Bito | G01R 33/3415 324/307 |
| 7,924,007 B2* | 4/2011 | Arnold | G01R 33/3415 324/309 |
| 8,035,389 B2 | 10/2011 | Xing et al. | |
| 8,049,504 B2* | 11/2011 | Findeklee | G01R 33/365 324/300 |
| 8,384,388 B2* | 2/2013 | Biber | G01R 33/3415 324/318 |
| 8,436,614 B2* | 5/2013 | Biber | G01R 33/281 324/318 |
| 8,467,846 B2* | 6/2013 | Rezzonico | A61B 5/0555 324/300 |
| 8,704,519 B2* | 4/2014 | Biber | A61B 5/064 324/307 |
| 8,749,238 B2* | 6/2014 | Biber | G01R 33/3621 324/318 |
| 8,773,131 B2 | 7/2014 | Mitsui et al. | |
| 9,316,709 B2* | 4/2016 | Hetherington | G01R 33/3415 |
| 9,689,945 B2* | 6/2017 | Nehrke | G01R 33/543 |
| 2002/0021128 A1 | 2/2002 | Kuhara | |
| 2002/0181753 A1* | 12/2002 | Ma | G01R 33/3415 382/131 |
| 2002/0186870 A1* | 12/2002 | Ma | G01R 33/3415 382/131 |
| 2004/0165757 A1* | 8/2004 | Ma | G01R 33/3415 382/131 |
| 2004/0167803 A1* | 8/2004 | Ma | G01R 33/3415 705/2 |
| 2005/0218895 A1 | 10/2005 | Belt et al. | |
| 2007/0069728 A1 | 3/2007 | Van Helvoort et al. | |
| 2008/0045830 A1* | 2/2008 | Rezzonico | A61B 5/0555 600/415 |
| 2008/0211502 A1* | 9/2008 | Arnold | G01R 33/3415 324/318 |
| 2008/0218166 A1* | 9/2008 | Arnold | A61B 5/0555 324/307 |
| 2008/0290870 A1* | 11/2008 | Misic | G01R 33/3415 324/318 |
| 2008/0303519 A1 | 12/2008 | Van Den Brink et al. | |
| 2009/0076377 A1* | 3/2009 | Findekelee | G01R 33/365 600/422 |
| 2009/0174498 A1 | 7/2009 | Xing et al. | |
| 2010/0001726 A1 | 1/2010 | Hori et al. | |
| 2010/0148778 A1* | 6/2010 | Biber | G01R 33/3415 324/318 |
| 2010/0156412 A1* | 6/2010 | Biber | G01R 33/281 324/318 |
| 2010/0182005 A1* | 7/2010 | Biber | G01R 33/341 324/307 |
| 2010/0271022 A1 | 10/2010 | Mitsui et al. | |
| 2011/0095758 A1* | 4/2011 | Walsh | A61B 5/055 324/307 |
| 2012/0112748 A1* | 5/2012 | Hetherington | G01R 33/34007 324/318 |
| 2012/0187949 A1* | 7/2012 | Biber | G01R 33/3621 324/322 |
| 2013/0106416 A1 | 5/2013 | Morich et al. | |
| 2013/0134975 A1* | 5/2013 | Nehrke | G01R 33/5612 324/309 |
| 2014/0159719 A1* | 6/2014 | Chon | G01R 33/3415 324/309 |
| 2017/0173262 A1* | 6/2017 | Veltz | A61M 5/1723 |

FOREIGN PATENT DOCUMENTS

| | | |
|---|---|---|
| CN | 102334990 A | 2/2012 |
| JP | 2007-510489 A | 4/2007 |
| JP | 2010-142411 A | 7/2010 |
| WO | 99/27381 A2 | 6/1999 |
| WO | 2006/016292 A1 | 2/2006 |
| WO | 2012/004728 A2 | 1/2012 |

OTHER PUBLICATIONS

Communication dated Feb. 26, 2014 issued by the European Patent Office in counterpart European Patent Application No. 13171666.4.
Communication dated Jun. 27, 2014 issued by the Korean Intellectual Property Office in counterpart Korean Patent Application No. 10-2012-141165.
Communication dated Dec. 2, 2015, issued by the State Intellectual Property Office of the People's Republic of China in counterpart Chinese Patent Application No. 201310306885.3.

* cited by examiner

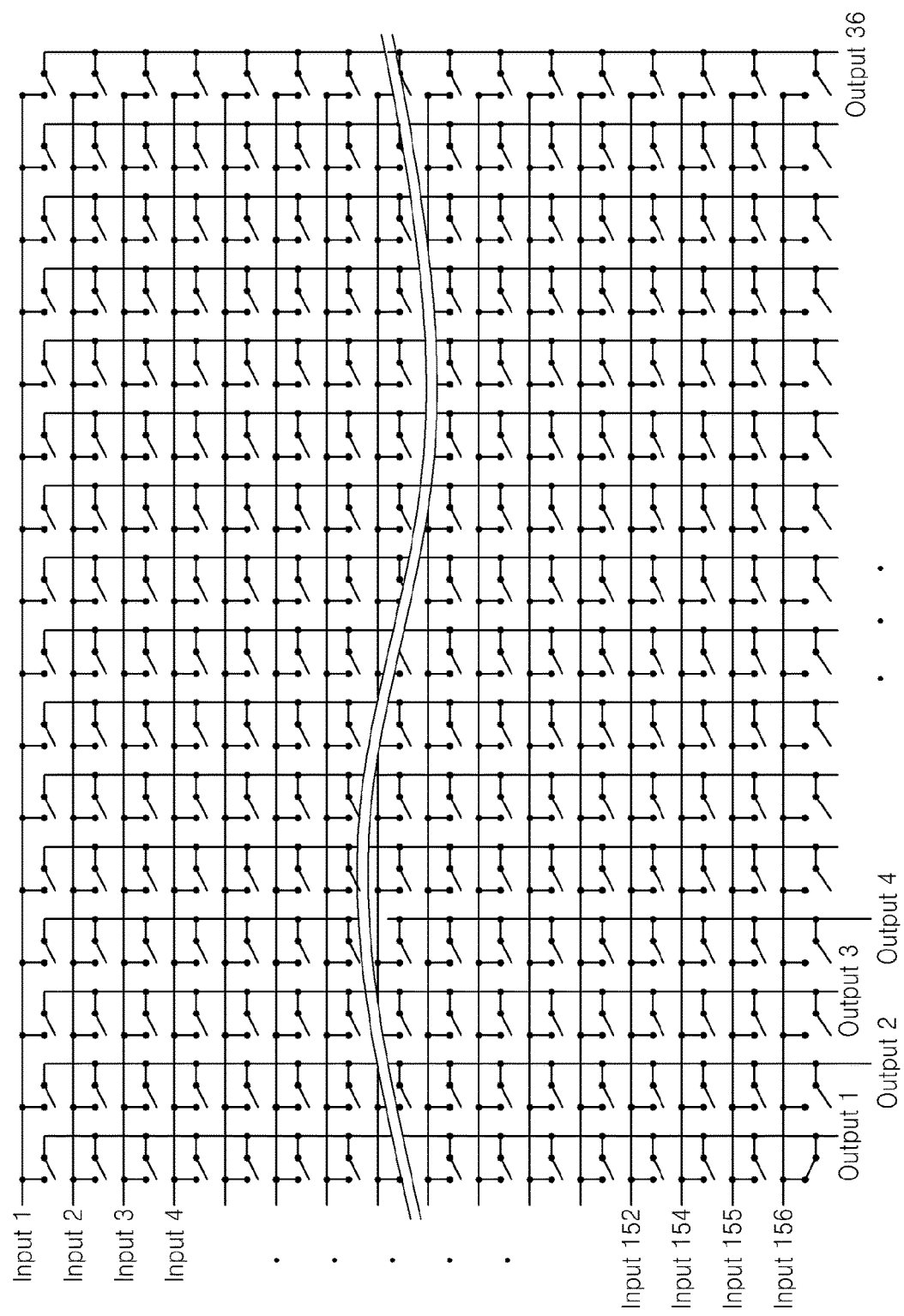

EXTERIOR

INTERIOR

METHOD AND APPARATUS FOR ACQUIRING IMAGE IN MAGNETIC RESONANCE IMAGING SYSTEM

CROSS-REFERENCE TO RELATED PATENT APPLICATION

This application claims the priority from Korean Patent Application No. 10-2012-0141165, filed on Dec. 6, 2012, in the Korean Intellectual Property Office, the disclosure of which is incorporated herein in its entirety by reference.

BACKGROUND

1. Field

Methods and apparatuses consistent with exemplary embodiments relate to acquiring an image in a magnetic resonance imaging (MRI) system, and more particularly, to acquiring an image having a reduced signal loss rate by shortening a process of acquiring a signal from a coil by using a switching device.

2. Description of the Related Art

MRI is a technique of acquiring an image of a target, i.e., of an object, by locating the object in an area where a magnetic field is generated, generating radio frequency (RF) pulses to make protons in the object resonate in order to measure a difference between signals coming out of tissue or the like from the object, and reconstructing an image of the object by a computer.

MRI provides images of high resolution and good contrast compared with other imaging techniques, and enables providing real-time deep organ images and three-dimensional (3D) information. Moreover, MRI is harmless to humans because there is no radiation exposure, and an axial image, a sagittal image, a coronal image, and the like may be obtained without changing the location of an object.

SUMMARY

According to an aspect of an exemplary embodiment, there is provided a method of acquiring an image in an MRI system, the method including dividing a scannable region of an object into a plurality of regions, determining a coil to be used for each of the divided regions, receiving signals from the determined coil via a plurality of signal channels connected to the determined coil and grouped by using at least one switching device, and acquiring the image from the received signals.

The switching device may control the output of signals that are received via the plurality of grouped signal channels.

The scannable region may include a region on a table on which the object is to be positioned.

The dividing of the scannable region of the object into the plurality of regions may include dividing a scannable region of the object on the table into a plurality of regions.

The determining of the coil to be used for each of the divided regions may include acquiring information about a connector on the table that is to be connected to the coil, extracting identification information for identifying the coil from the acquired information, and identifying the coil based on the identification information.

The receiving of the signals from the determined coil via the plurality of signal channels connected to the determined coil and grouped by using at least one switching device may include allocating the plurality of signal channels to the plurality of divided regions, acquiring allocation information about the plurality of signal channels allocated to correspond to the plurality of divided regions, controlling the switching device based on the identification information and the acquired allocation information; and receiving the signals from the determined coil based on the control.

The controlling of the switching device may include enabling a signal channel allocated to a to-be-scanned region from among the plurality of divided regions in order to acquire an image of the to-be-scanned region.

The switching device may be a device that includes a plurality of input units and a single output unit.

The acquiring of the image from the received signals may include acquiring the image of the to-be-scanned region by combining the received signals.

According to another aspect of an exemplary embodiment, there is provided an apparatus for acquiring an image in an MRI system, the apparatus including a region identifier which divides a scannable region of an object into a plurality of regions, a determinator which determines a coil to be used for each of the divided regions, a receiver which receives signals from the determined coil via a plurality of signal channels which are connected to the determined coil and grouped by using at least one switching device, and an image processor which acquires the image from the received signals.

The switching device may control the output of signals that are received via the plurality of grouped signal channels.

The scannable region may include a region on a table on which the object is to be positioned.

The region identifier may divide a scannable region of the object on the table into a plurality of regions.

The determinator may include an information processor which acquires information about a connector on the table that is to be connected to the coil, an extractor which extracts identification information for identifying the coil from the acquired information, and an identifier which identifies the coil based on the identification information.

The receiver may include an allocator which allocates the plurality of signal channels to the plurality of divided regions, an information processor which acquires allocation information about the plurality of signal channels allocated to correspond to the plurality of divided regions, and a controller which controls the switching device based on the identification information and the acquired allocation information.

The receiver may receive signals from the determined coil based on the control.

The controller may enable a signal channel allocated to a to-be-scanned region from among the plurality of divided regions in order to acquire an image of the to-be-scanned region.

The switching device may be a device that includes a plurality of input units and a single output unit.

The image processor may acquire the image of the to-be-scanned region by combining the received signals.

According to another aspect of an exemplary embodiment, there is provided a non-transitory computer-readable storage medium having recorded thereon a program for executing the above-described method.

BRIEF DESCRIPTION OF THE DRAWINGS

The above and/or other aspects of exemplary embodiments will become more apparent by describing certain exemplary embodiments, with reference to the accompanying drawings, in which:

FIGS. 1A and 1B illustrate an input/output relationship of a signal that has a related art switching matrix structure;

DETAILED DESCRIPTION

Figure 1B:
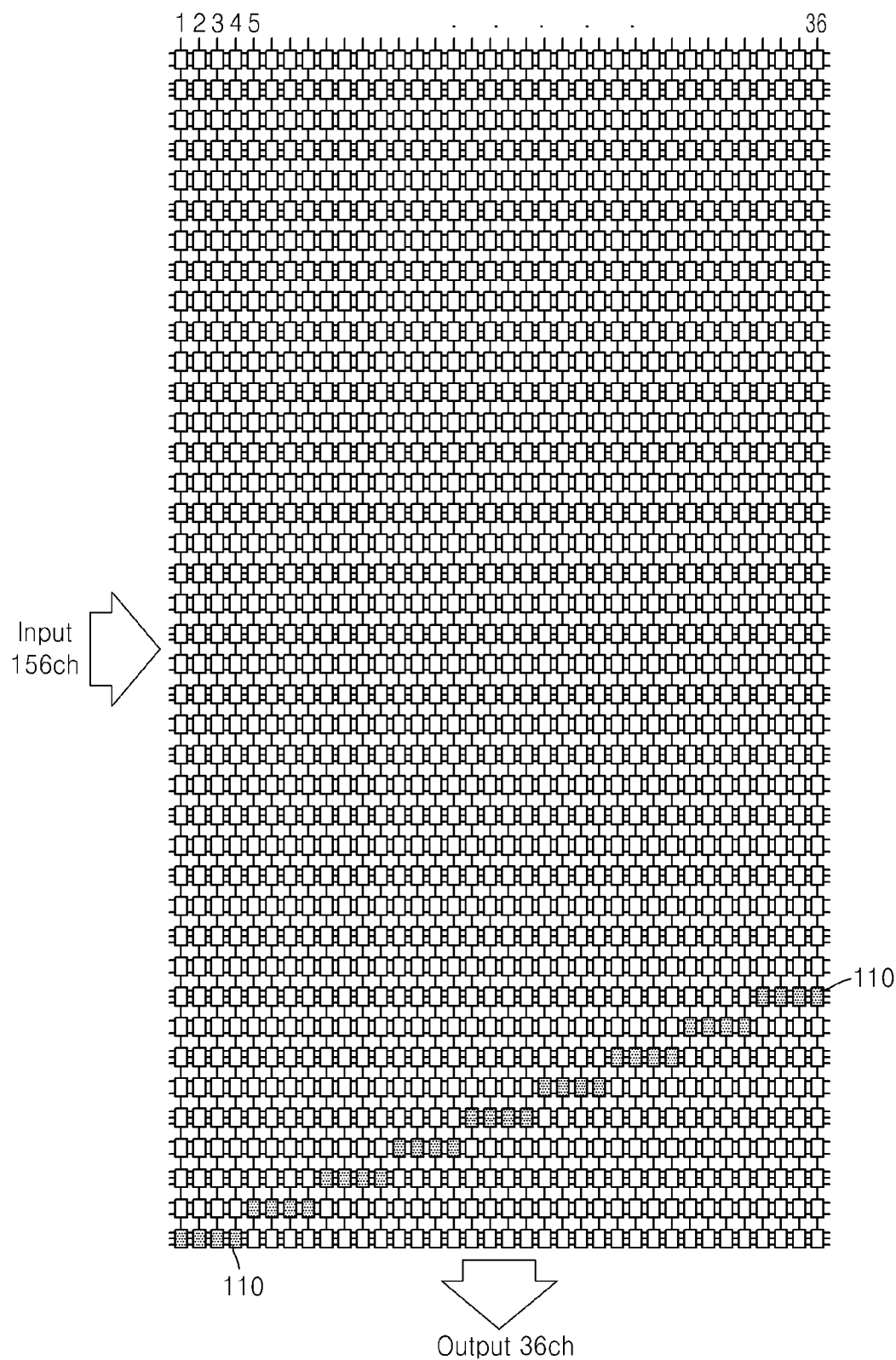

Below, certain exemplary embodiments are described in greater detail with reference to the accompanying drawings.

In the following description, like reference numerals are used for the like elements, even in different drawings. The matters defined in the description, such as detailed construction and elements, are provided to assist in a comprehensive understanding of exemplary embodiments. However, exemplary embodiments can be carried out without those specifically defined matters. Also, well-known functions or constructions are not described in detail since that would obscure the description with unnecessary detail.

Expressions such as "at least one of" when preceding a list of elements, modify the entire list of elements and do not modify the individual elements of the list.

It should be understood that the terms "comprises" and/or "comprising" or "includes" and/or "including" specify the presence of stated elements, but do not preclude the presence or addition of one or more other elements. Terms such as "unit" and "module" stated in the specification denote units that process at least one function or operation, and they may be implemented by using hardware, software, or a combination of hardware and software.

FIGS. 1A and 1B illustrate a signal input/output relationship that has a related art switching matrix structure.

A related art MRI signal processing system has a switching matrix structure that receives signals from all of the input channels corresponding to each of the coils included in an MRI system and processes the received signals to transmit desired output signals.

For example, when the number of RF signal channels of all of the coils used in an MRI system is 156, a switching matrix for receiving only desired signals from 156 channels and outputting only the desired signals is needed to acquire a desired field of view (FOV) image.

For example, with reference to FIGS. 1A and 1B, if thirty six channels are needed to obtain a desired FOV image, a switching matrix structure is needed to output thirty six signals from 156 RF signal channels. The number of switching devices needed to receive input signals via 156 channels and output signals via thirty six channels is 156×36, or 5,616.

Thus, a related art switching matrix structure individually controls at least 5,616 switching devices to output desired signals. For example, switching devices through which signals can pass are illustrated as shadowed portions 110 in FIG. 1B.

Further, at least twenty application specific integrated circuits (ASICs) are needed to control each of the switching devices described above. Since about twenty ASICs are further needed in addition to the 5,616 switching devices in order to accomplish a related art switching matrix, the size of a board formed of the switching devices becomes of a great size.

Moreover, when a signal passes through one switching device, a signal loss of 0.3 through 0.7 dB is generated. Accordingly, in the case that thirty six switching devices are used to output desired signals, a signal loss of about 18 dB (36×0.5 dB) may be generated. Accordingly, to offset a signal loss, low-noise amplifiers (LNAs) and/or filters need to be used at least at one of an input end and an output end of each channel.

An exemplary embodiment may substantially reduce a signal loss rate and improve a signal processing speed by outputting a signal from the coils via substantially reduced number of switching devices.

In addition, due to the reduction of the signal loss rate, installation of an LNA at an input end or an output end of a channel may be omitted.

For example, when thirty six output channels are needed to output desired signals, thirty six switching devices are needed and at least one ASIC is needed to control thirty six switching devices. Thus, about 90% or more of reduction may be obtained in terms of the number of switching devices used, compared with a related art switching matrix. Moreover, compared with a related art switching matrix, the number of switching devices through which signals pass may be drastically reduced, and accordingly a signal loss rate may be maintained at about 2% or less.

Figure 2:
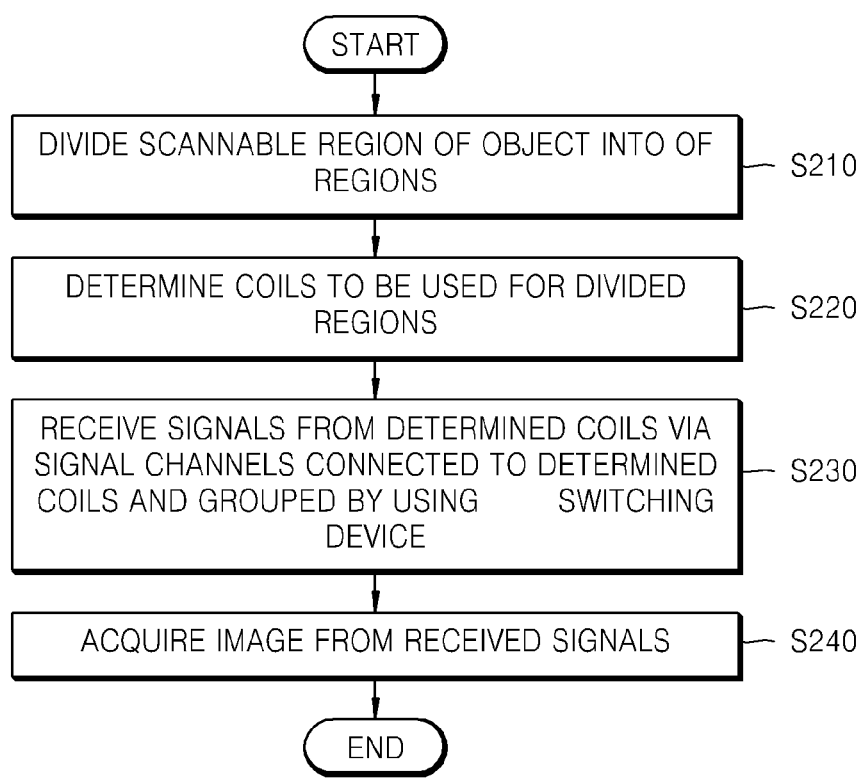
FIG. 2 is a flowchart of a method of acquiring an image in an MRI system, according to an exemplary embodiment.

FIG. 2 is a flowchart of a method of acquiring an image in an MRI system, according to an exemplary embodiment.

Referring to FIG. 2, the method may include operation S210 of dividing a scannable region of an object into a plurality of regions, operation S220 of determining a coil to be used for each of the divided regions, operation S230 of receiving signals from the determined coil via a plurality of signal channels connected to the determined coil and grouped by using at least one switching device, and operation S240 of acquiring an image from the received signals.

The switching device according to an exemplary embodiment may control the output of a signal that is received via a plurality of grouped signal channels.

Figure 3:
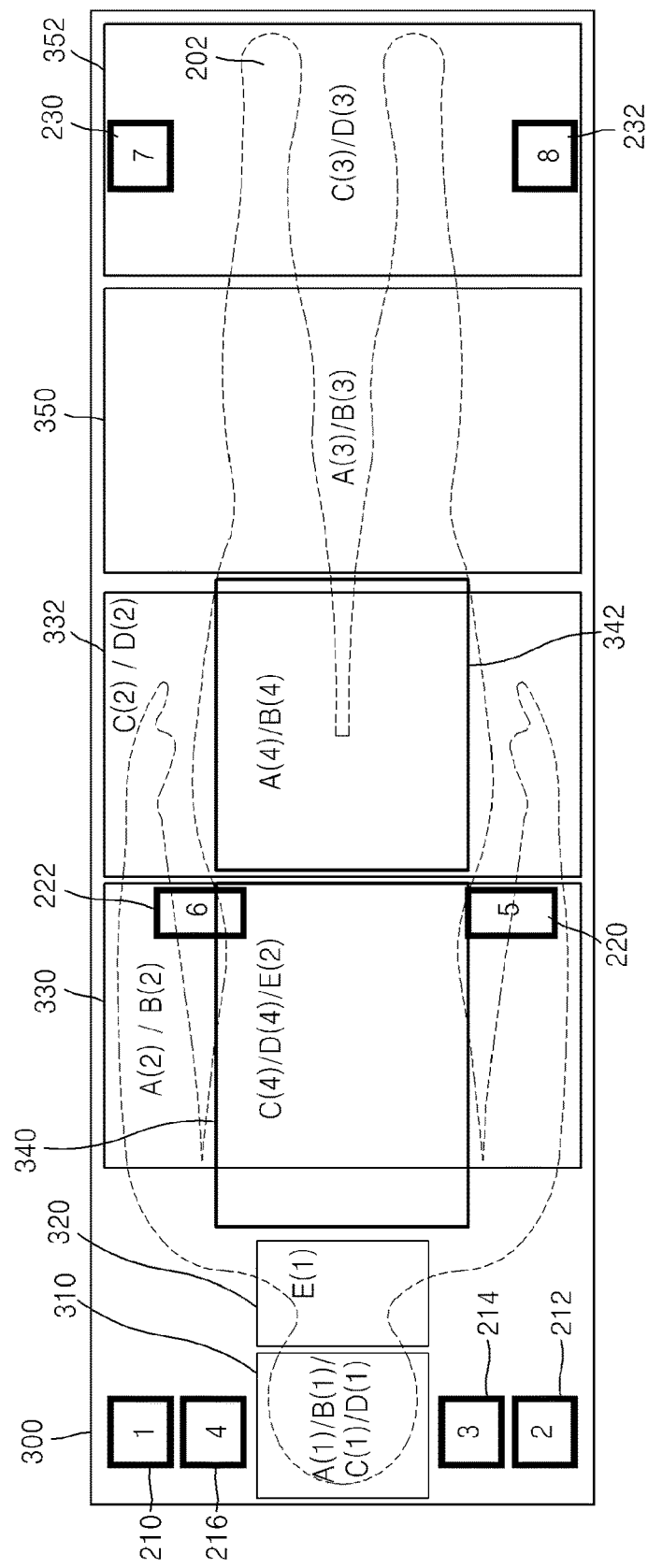
FIG. 3 illustrates a scannable region of an object that is divided into a plurality of regions, according to an exemplary embodiment.

FIG. 3 illustrates a scannable region of an object that is divided into a plurality of regions, according to an exemplary embodiment.

The scannable region may be a region on a table 300 on which an object is positioned. The table 300 may be a patient table or the like for an MRI scan.

The operation S210 of dividing a scannable region of an object into a plurality of regions may include dividing the scannable region of the object into a plurality of regions 310 through 352 or dividing the table 300 into the regions 310 through 352.

For example, when the object is a human body, the corresponding area of the table 300 or the scannable region of the object may be divided into a head region 310, a neck region 320, a first body region 330, a second body region 332, a first spine region 340, a second spine region 342, a first lower body region, i.e., a first peroneal artery (PA)

region 350, and a second lower body region, i.e., a second PA region 352. The regions 310 through 352 may be defined by blocks as illustrated in FIG. 3, by rectangular shapes, or by any other appropriate shapes.

The operation S220 of determining a coil to be used for each divided region may include operations of acquiring information about the connectors disposed on or in the table 300, which are to be connected to coils (not shown), extracting identification information for identifying the coil from the acquired information, and identifying the coil based on the identification information.

For example, coils that may be used to scan the head region 310, the neck region 320, the first body region 330, and/or the second body region 332 may be connected to at least one of first, second, third and fourth connectors 210, 212, 214, and 216 shown by square boxes 1 through 4 in FIG. 3. A coil that may be used to scan the first spine region 340 and/or the second spine region 342 may be connected to at least one of fifth and sixth connectors 220 and 222 shown by square boxes 5 and 6. A coil that may be used to scan the first PA region 350 and/or the second PA region 352 may be connected to at least one of seventh and eighth connectors 230 and 232 shown by square boxes 7 and 8.

For example, thirty six signal channels may be used for scanning the head region 310 and the neck region 320, thirty two signal channels may be used for scanning the first body region 330 and the second body region 332, forty signal channels may be used for scanning the first spine region 340 and the second spine region 342, and thirty two signal channels may be used for scanning the first PA region 350 and the second PA region 352.

Information about connectors according to an exemplary embodiment may include connector unique numbers and information about connections between connectors and coils.

For example, the information about connection or disconnection between connectors and coils may be an on-state information when a connector is connected to a coil, and may be an off-state information when a connector is disconnected from a coil.

The identification information according to an exemplary embodiment may be included in the information about connection or disconnection between connectors and coils. The identification information may include coil unique numbers assigned to coils connected to connectors, information about the locations of the coils, and the like.

According to an exemplary embodiment, a coil connected to a connector may be identified by acquiring, for example, information about the location of the coil by using the coil unique number. Thus, signal channels connected to the coil may be identified.

Figure 4A:
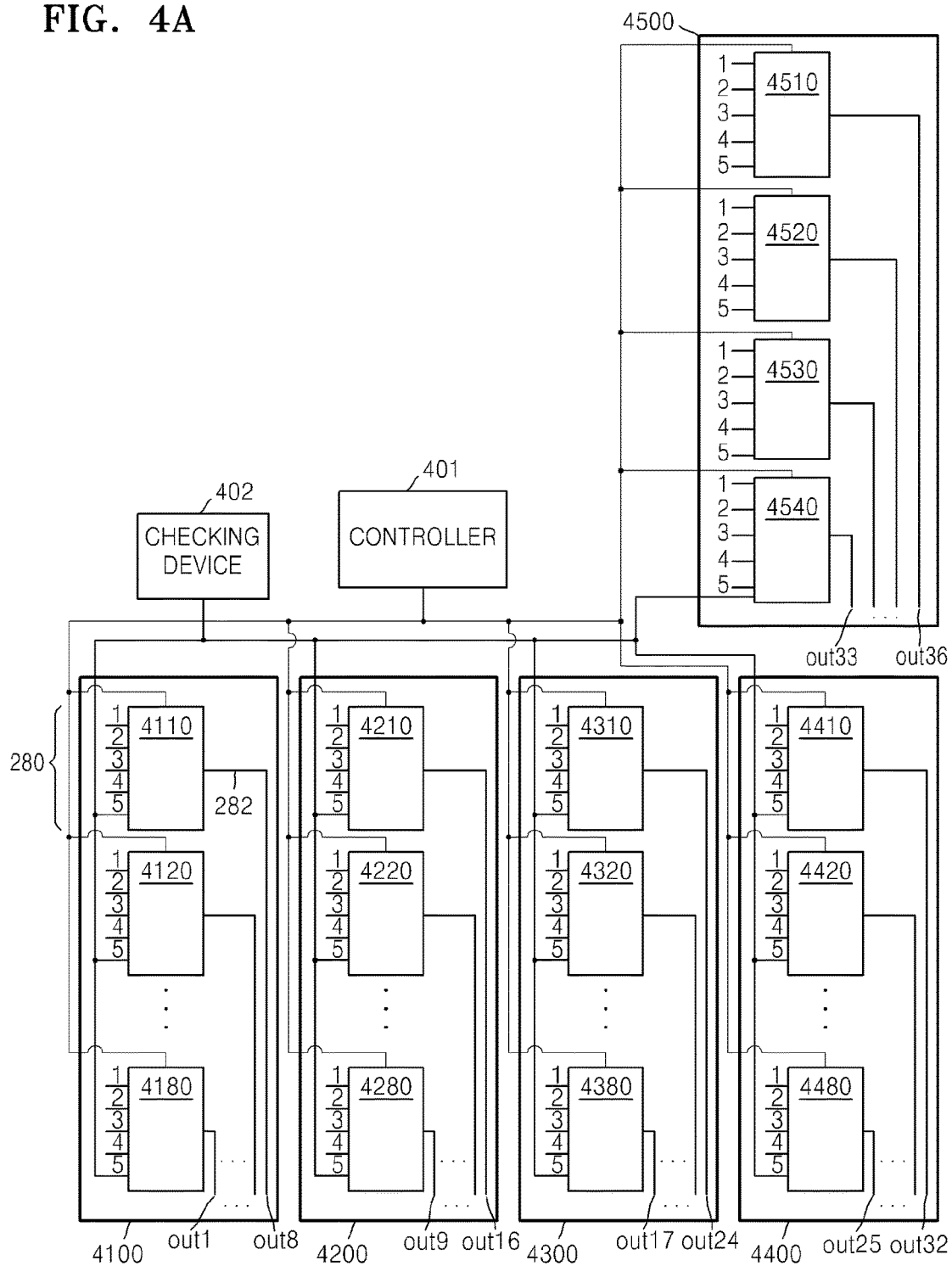
FIG. 4A is a schematic view of grouping of a plurality of signal channels, according to an exemplary embodiment.

FIG. 4A is a schematic view of grouping of a plurality of signal channels, according to an exemplary embodiment.

The operation S230 of receiving a signal from the determined coil via a plurality of signal channels which are connected to the determined coil and are grouped by using at least one switching device may include operations of allocating a plurality of signal channels to the divided regions, acquiring allocation information about the signal channels allocated to correspond to the divided regions, controlling switching devices based on the identification information and the acquired allocation information, and receiving the signal from the determined coil.

For example, a plurality of signal channels may be included in at least one of the first, second, third, fourth and fifth groups 4100, 4200, 4300, 4400, and 4500. For example, the signal channels may be grouped into the first, second, third, fourth and fifth groups 4100 through 4500 by using at least one switching device.

As shown in FIG. 4A, the switching devices may be denoted as 4110 and 4120 through 4180 for the first group 4100, as 4210 and 4220 through 4280 for the second group 4200, as 4310 and 4320 through 4380 for the third group 4300, as 4410 and 4420 through 4480 for the fourth group 4400, and as 4510, 4520, 4530, and 4540, for the fifth group 4500.

For example, a plurality of signal channels may be grouped into a group by using a plurality of switching devices each having a plurality of input channels and a number of output channels less than a number of input channels. For example, the switching device may include an SP5T switch which has five input channels 280 and one output channel 282. The SP5T switch is known to those skilled in the art and a detailed description thereof is omitted.

As illustrated in an example of FIG. 4A, in order to output signals via eight signal output channels, each of the first, second, third, and fourth groups 4100 through 4400 may use eight SP5T switching devices. To output signals via four signal output channels, the fifth group 4500 may use four SP5T switching devices. The number of SP5T switching devices used is not limited to eight or four in any of the groups and other appropriate number of SP5T switching devices may be used in any of the groups.

According to an exemplary embodiment, a plurality of signal channels may be allocated to the divided regions.

For example, the number of input signal channels corresponding to the coils to scan the head region 310 that are input to switching devices may be thirty two, and thirty two input signal channels may be divided into four groups of eight channels or may be divided in a different manner, as for example, into sixteen upper channels and sixteen lower channels.

The four groups of divided thirty two input signal channels may be connected to, for example, each of the first ports 254 of the switching devices of the first, second, third, and fourth groups 4100 through 4400.

Referring to FIG. 3, the grouped signal channels are allocated to the divided regions. For example, eight output signal channels of a coil to be used to scan the head region 310 are allocated to respective first ports 254 of the switching devices 4110 through 4180 included in the first group 4100 of FIG. 4A. Remaining twenty four signal channels used for the scan of the head region 310 may be allocated to the each of the first ports 254 of the switching devices of the second, third, and fourth groups 4200, 4300, and 4400.

According to an exemplary embodiment, the operation of acquiring the allocation information about the signal channels allocated to correspond to the divided regions may include an operation of acquiring allocation information representing how the signal channels are respectively allocated to the divided regions.

According to an exemplary embodiment, the allocation information may include the information representing how the signal channels are respectively allocated to the divided regions. For example, the information representing how the signal channels are respectively allocated to the divided regions may include information about the signals channels allocated to the regions.

As shown in FIG. 3 with respect to the head region 310, such information may be A(1), B(1), C(1), and D(1) corresponding to the first ports 254 of the switching devices of the first, second, third, and fourth groups 4100, 4200, 4300, and

4400. Further, four signal channels may be used to acquire an image of the neck region 320, and the signal channels associated with the neck region 320 may be allocated to the first ports 254 of the fifth group 4500, as indicated by E(1) in FIG. 3, and may be grouped.

The operation S230 of receiving signals may include an operation of controlling switching devices based on the identification information and the acquired allocation information.

The operation S230 of receiving signals may further include an operation of receiving signals from a determined coil based on the control of the switching devices.

Figure 4B:
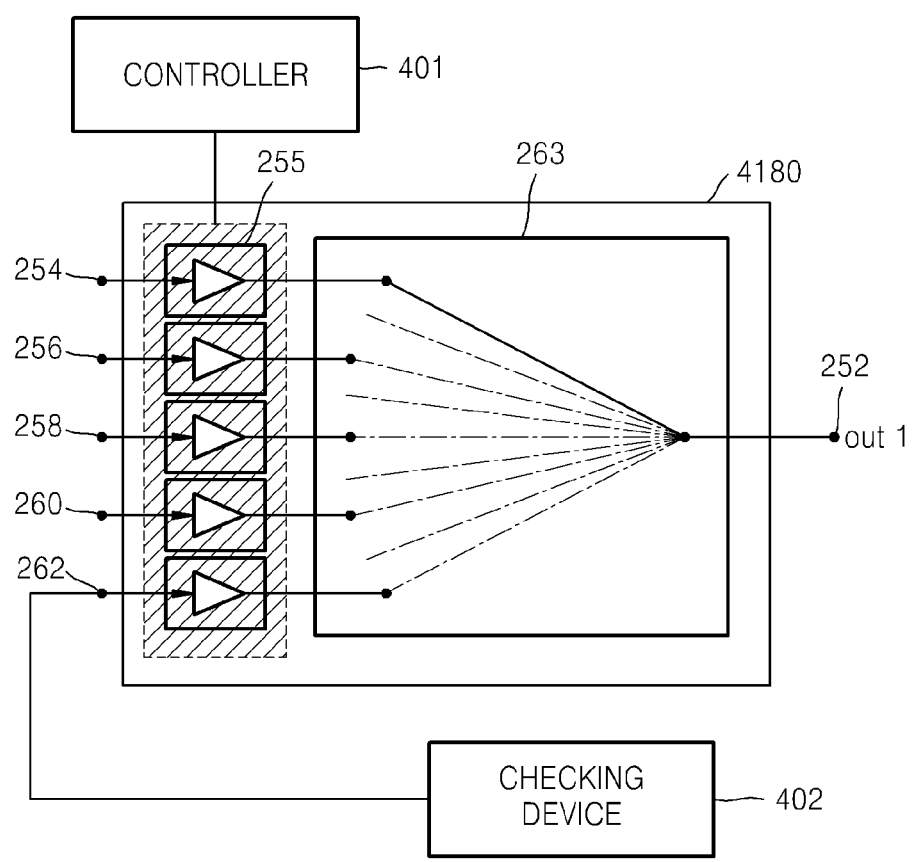
FIG. 4B is a schematic view of a switching device according to an exemplary embodiment.

FIG. 4B is a schematic view of the switching device 4180 according to an exemplary embodiment.

An operation of controlling the switching device 4180 according to an exemplary embodiment may include enabling a signal channel allocated to a region to be scanned.

For example, the first ports 254 of the first group 4100, the first ports 254 of the second group 4200, the first ports 254 of the third group 4300, and the first ports 254 of the fourth group 4400 may be used to acquire an image of the head region 310, as described above. Accordingly, a signal may be received from a coil by enabling the respective first ports 254 of the switching devices of the first, second, third, and fourth groups 4100 through 4400, to which the signal channels associated with the scan of the head region 310 are allocated. The image of the region to be scanned may be acquired using signals received via open ports under the control of corresponding switching devices.

Enabling of signal channels according to an exemplary embodiment may include opening ports for the channels grouped and connected to switching devices.

The switching devices may be controlled by a controller 401 which may generate a control signal for enabling the signal channels allocated to the region to be scanned, and the switching devices may enable the signal channels according to the control signal.

A switching device, as for example, the switching device 4180, according to an exemplary embodiment may include a plurality of input units 255 connected to first, second, third, fourth and fifth input ports 254, 256, 258, 260, and 262 and a single output unit 263 connected to an output port 252. The first, second, third, fourth and fifth input ports 254, 256, 258, 260, and 262 are connected with the respective input signal channels. For example, the switching device according to an exemplary embodiment may be an SP5T RF switching integrated circuit (IC) including five input ports and one output port.

An LNA may be omitted from the switching device, as for example, the switching device 4180, according to an exemplary embodiment. That is, because of the reduced number of the switching devices, the noise rate may be substantially reduced and the inclusion of the LNA on an input end and/or an output end of the switching device may be prevented.

A checking device 402 according to an exemplary embodiment may be a device for checking an error or the like occurring on the path of a channel for receiving a signal from a coil or may be a device for transmitting a signal for calibrating the gain and loss of the signal. In other words, a signal transmitted by the checking device 402 may enable determination as to whether a signal channel malfunctions, re-setting of a gain value, and the like. Calibration of a signal channel by the checking device 402 may be done by using a calibrating method that is known to be used in the art of an MRI.

The operation S240 of acquiring an image from the received signals may include combining the received signals to acquire an image of the region of interest (ROI).

Figure 5:
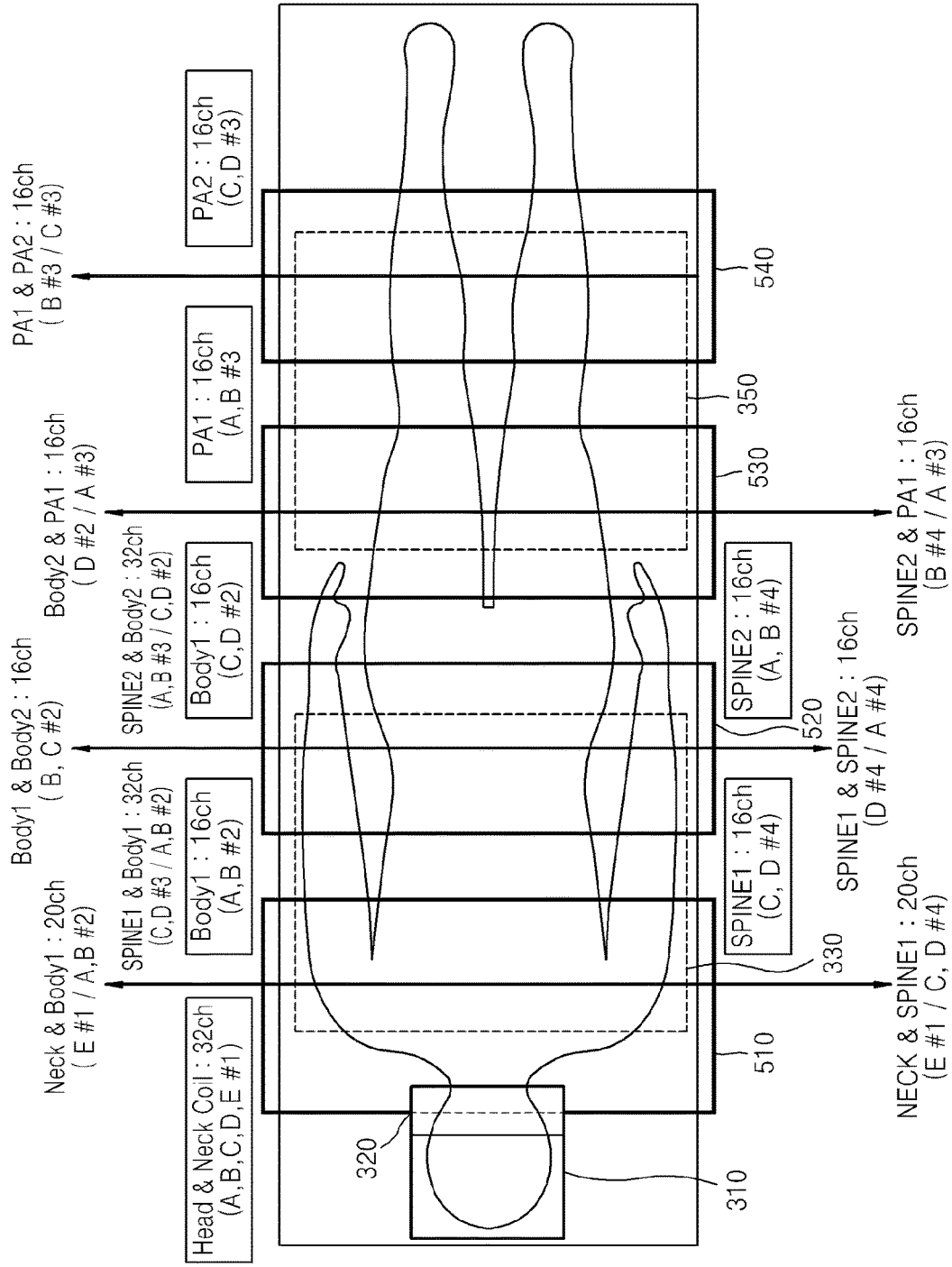
FIG. 5 illustrates acquisition of an image of a region to be scanned by using a switching device, according to an exemplary embodiment.

FIG. 5 illustrates acquisition of an image of a region to be scanned by using switching devices, according to an exemplary embodiment.

In an example illustrated in FIG. 3, images of the head region 310 and the neck region 320 may be acquired by enabling the first ports 254 of switching devices included in the first, second, third, fourth and fifth groups 4100 through 4500. An image of the first spine region 340 may be acquired by enabling the fourth ports 260 of the third group 4300, the fourth ports 260 of the fourth group 4400, and the second ports 256 of the fifth group 4500. An image of the second spine region 342 may be acquired by enabling the fourth ports 260 of the first group 4100 and the fourth ports 260 of the second group 4200. An image of the first body region 330 may be acquired by enabling the second ports 256 of the first group 4100 and the second ports 256 of the second group 4200. An image of the second body region 332 may be acquired by enabling the second ports 256 of the third group 4300 and the second ports 256 of the fourth group 4400. An image of the first PA region 350 may be acquired by enabling the third ports 258 of the first group 4100 and the third ports 258 of the second group 4200. An image of the second PA region 352 may be acquired by enabling the third ports 258 of the third group 4300 and the third ports 258 of the fourth group 4400.

Further, as illustrated in FIG. 5, an image a region 510 including a part of the neck region 320 and a part of the first spine region 340 may be acquired by using signal channels allocated to the neck region 320, as for example, the first ports 254 of the fifth group 4500, and signal channels allocated to the first spine region 340, as for example, the fourth ports 260 of the third and fourth groups 4300 and 4400. An image including a part of the neck region 320 and a part of the first body region 330 of the region 510 may be acquired by enabling the signal channels allocated to the neck region 320, as for example, the first ports 254 of the fifth group 4500, and signal channels allocated to the first body region 330, as for example, the second ports 256 of the first and second groups 4100 and 4200.

In other words, overlapping images between the divided regions 510, 520, 530, and 540 may be acquired using the allocation information about allocations of the signal channels allocated to the divided regions 310 through 352.

For convenience of explanation, a scan of only a predetermined portion of an object, for example, the head region 310 or the neck region 320 is described, but an exemplary embodiment is not limited thereto. For example, all of the coils may be used to acquire an image of the entire object.

For example, when all of the coils are used to acquire an image of the entire object, the image of the entire object may be acquired by acquiring information about each connector and identification information for identifying a coil connected to each connector and receiving a signal from an identified coil.

For example, an image of the entire object from the head to the feet may be acquired by sequentially receiving signals from all of the coils, for example, receiving a signal from a coil used to scan the head region 310, receiving a signal from a coil used to scan the neck region 320, etc.

In this case, switching devices may be controlled so that the signal channels corresponding to the regions 310 through 352 are enabled. For example, the image of the entire object may be acquired by sequentially controlling the signal channels, such as, enabling the signal channels allocated to the head region 310, enabling the signal channels allocated to the neck region 320, etc.

Figure 6:
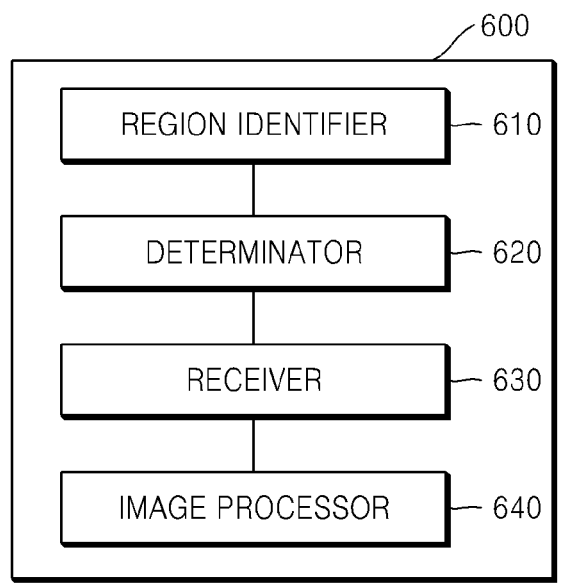
FIG. 6 is a block diagram of an apparatus for acquiring an image in an MRI system, according to an exemplary embodiment.

FIG. 6 is a block diagram of an image acquiring apparatus 600 in an MRI system, according to an exemplary embodiment.

Referring to FIG. 6, the image acquiring apparatus 600 may include a region identifier 610, which divides a scannable region of an object into a plurality of regions, a determinator 620, which determines a coil to be used for each of the divided regions, a receiver 630, which receives signals from the determined coil via a plurality of signal channels connected to the determined coil and grouped by using at least one switching device, and an image processor 640, which acquires an image from the received signals.

The switching device according to an exemplary embodiment may control the output of signals received via a plurality of grouped signal channels.

Figure 7:
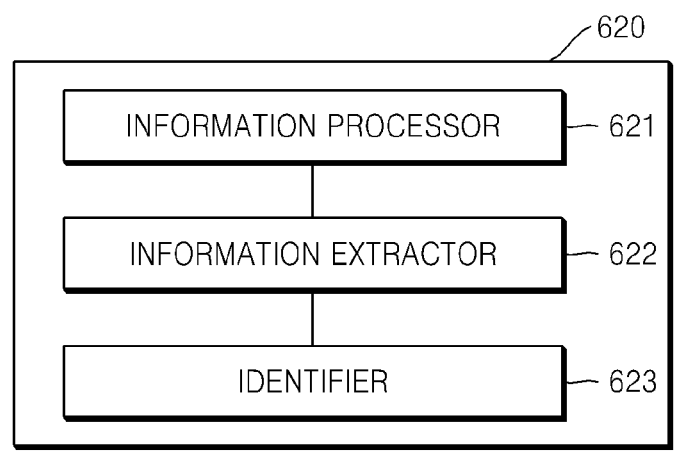
FIG. 7 is a block diagram of a determinator included in the apparatus illustrated in FIG. 6, according to an exemplary embodiment.

FIG. 7 is a block diagram of the determinator 620 according to an exemplary embodiment.

Referring to FIG. 7, the determinator 620 may include an information processor 621, which acquires information about the connectors on a table which are to be connected to coils, an information extractor 622, which extracts identification information for identifying coils from the acquired information, and an identifier 623, which identifies the coils based on the identification information.

Figure 8:
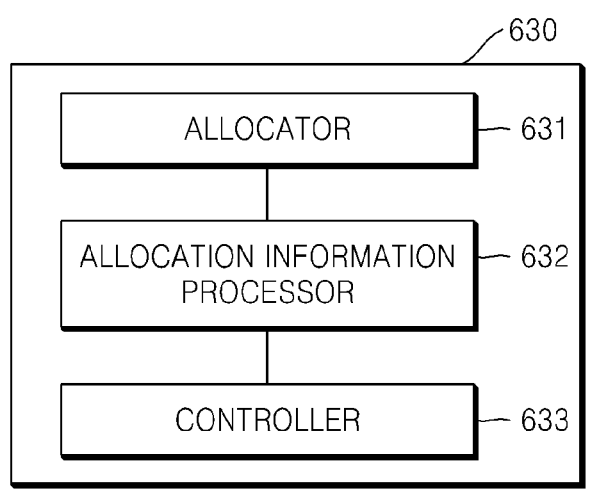
FIG. 8 is a block diagram of a receiver in the apparatus illustrated in FIG. 6, according to an exemplary embodiment.

FIG. 8 is a block diagram of the receiver 630 according to an exemplary embodiment.

Referring to FIG. 8, the receiver 630 may include an allocator 631, which allocates a plurality of signal channels to the divided regions, an allocation information processor 632, which acquires allocation information about the signal channels allocated to correspond to the divided regions, and a controller 633, which controls switching devices based on the identification information and the acquired allocation information. The controller 633 may correspond to the controller 401 described above.

The receiver 630 may receive signals from the determined coil based on the control by the controller 633.

The controller 633 may enable the signal channels allocated to a region to be scanned, in order to acquire an image of the ROI.

The image processor 640 may combine the received signals to acquire the image of the region.

Figure 9A:
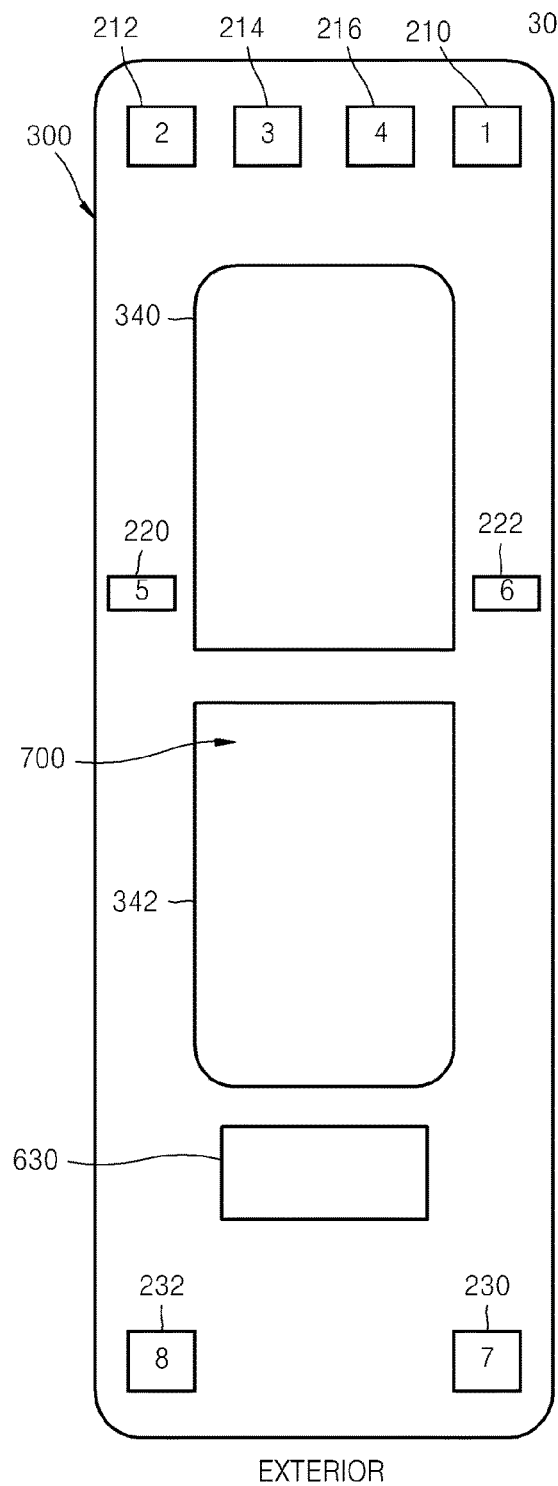
FIGS. 9A and 9B illustrate a receiver according to an exemplary embodiment.
Figure 9B:
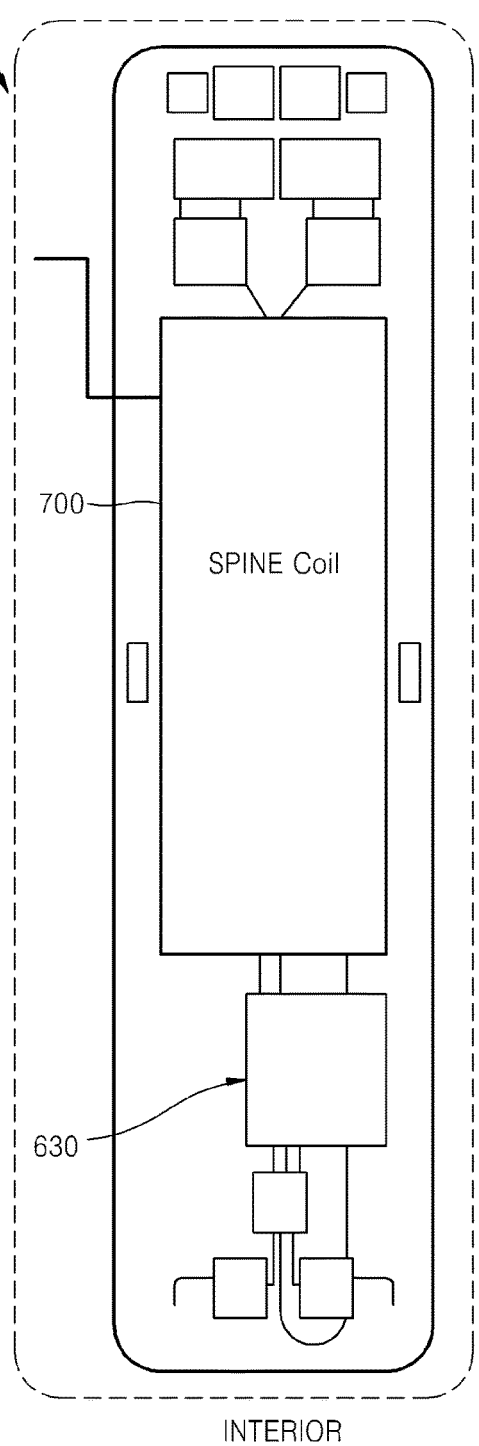

FIGS. 9A and 9B are block diagrams of a receiver 630 according to an exemplary embodiment.

The receiver 630 may be included in the table 300, on which an object is positioned and may be miniaturized.

For example, the receiver 630 may be disposed proximate a lower end of a coil 700, which is used to scan the first and/or second spine region 340, 342, on the table 300, but the location of the receiver 630 is not limited thereto.

Due to the inclusion of the receiver 630 in the table 300, the length of a cable that forms signal channels which are connected to the receiver 630 may be reduced. In addition, a signal-to-noise ratio (SNR) may be improved.

The above-described exemplary embodiments may be written as computer programs and may be implemented in computers that execute the programs by using a non-transitory computer-readable storage medium.

Examples of the non-transitory computer-readable storage medium include magnetic storage media (e.g., ROM, floppy disks, hard disks, etc.), optical storage media (e.g., CD-ROMs or DVDs), etc.

Although a few exemplary embodiments have been shown and described, it would be appreciated by those skilled in the art that various changes in form and detail may be made in these exemplary embodiments without departing from the spirit and scope of the disclosure, the scope of which is defined by the claims and their equivalents.

What is claimed is:

1. A method of acquiring an image in a magnetic resonance imaging (MRI) system, the method comprising:

dividing, by a processor, a scannable region of an object into regions;

determining, by the processor, a coil to be used for each of the regions, the determined coil of each of the regions outputting coil signals acquired from the object, through MR signal channels connected to the determined coil and grouped with switching devices, wherein each of the switching devices comprises one output channel and input channels, and each of the input channels is selectively connectable to the one output channel;

receiving, by a receiver, the coil signals, which are input through the MR signal channels connected to the input channels of the grouped switching devices and output from the one output channel of each of the grouped switching devices; and acquiring, by an image processor, the image from the coil signals received via the one output channel of each of the grouped switching devices, wherein each of the switching devices comprises a plurality of input units corresponding to the input channels and one common output terminal corresponding to the one output channel, each of the switching devices has a construction in which the one common output terminal is connected to one input unit at a time, among the plurality of input units, thereby connecting the one output channel to one of the input channels, the switching devices comprise a first switching device having a first plurality of input channels, as the input channels, and a second switching device having a second plurality of input channels, as the input channels, the determining the coil comprises determining a first coil to be used for a first region, among the regions, and a second coil to be used for a second region, among the regions, the MR signal channels of the first coil comprise first MR signal channels connected to a first input channel of the first plurality of input channels and a first input channel of the second plurality of input channels, respectively, and the MR signal channels of the second coil comprise second MR signal channels connected to a second input channel of the first plurality of input channels and a second input channel of the second plurality of input channels, respectively.

2. The method of claim 1, wherein the scannable region comprises an area on a table on which the object is to be positioned for imaging, and the dividing the scannable region comprises dividing the area on the table into the regions.

3. The method of claim 2, wherein the determining the coil further comprises:

acquiring information about connectors on the table which are to be connected to the first coil and the second coil;

extracting identification information for identifying the first coil and the second coil from the acquired information; and identifying the first coil and the second coil based on the identification information.

4. The method of claim 3, wherein the receiving the coil signals comprises:
   allocating the first MR signal channels and the second MR signal channels to the first region and the second region, respectively;
   acquiring allocation information about the first MR signal channels and the second MR signal channels allocated to correspond to the first region and the second region, respectively;
   controlling the first switching device and the second switching device based on the identification information and the acquired allocation information; and
   receiving the coil signals from at least one from among the first coil and the second coil based on the controlling.

5. The method of claim 4, wherein at least one from among the first region and the second region comprises a region of interest (ROI) to be scanned,
   the controlling comprises enabling at least one from among the first MR signal channels and the second MR signal channels that is allocated to the ROI, and
   the acquiring the image comprises acquiring an image of the ROI.

6. A non-transitory computer-readable storage medium having recorded thereon a program for executing the method of claim 1.

7. The method of claim 5, wherein the acquiring the image further comprises acquiring the image of the ROI by combining the coil signals.

8. An apparatus for acquiring an image in a magnetic resonance imaging (MRI) system, the apparatus comprising:
   switching devices, each switching device comprising one output channel and input channels, each of the input channels being selectively connectable to the one output channel;
   a processor configured to divide a scannable region of an object into regions, and to determine a coil to be used for each of the regions, the determined coil of each of the regions outputting coil signals acquired from the object, through MR signal channels connected to the determined coil and grouped with the switching devices;
   a receiver configured to receive the coil signals, which are input through the MR signal channels connected to the input channels of the grouped switching devices and output from the one output channel of each of the grouped switching devices; and
   an image processor configured to acquire the image from the coil signals received via the one output channel of each of the grouped switching devices,
   wherein each of the switching devices comprises a plurality of input units corresponding to the input channels and one common output terminal corresponding to the one output channel,
   each of the switching devices has a construction in which the one common output terminal is connected to one input unit at a time, among the plurality of input units, thereby connecting the one output channel to one of the input channels,
   the switching devices comprise a first switching device having a first plurality of input channels, as the input channels, and a second switching device having a second plurality of input channels, as the input channels, the processor is further configured to determine a first coil to be used for a first region, among the regions, and a second coil to be used for a second region, among the regions,
the MR signal channels of the first coil comprise first MR signal channels connected to a first input channel of the first plurality of input channels and a first input channel of the second plurality of input channels, respectively, and
the MR signal channels of the second coil comprise second MR signal channels connected to a second input channel of the first plurality of input channels and a second input channel of the second plurality of input channels, respectively.

9. The apparatus of claim 8, wherein the scannable region comprises an area on a table on which the object is to be positioned, and
   the processor is further configured to divide the area on the table into the regions.

10. The apparatus of claim 9, wherein the processor is further configured to:
    acquire information about connectors on the table which are to be connected to the first coil and the second coil, respectively;
    extract identification information for identifying the first coil and the second coil from the acquired information; and
    identify the first coil and the second coil based on the identification information.

11. The apparatus of claim 10, wherein the receiver comprises:
    an information processor configured to acquire allocation information about the first MR signal channels and the second MR signal channels allocated to correspond to the first region and the second region, respectively; and
    a controller configured to control the first switching device and the second switching device based on the identification information and the acquired allocation information, and
    wherein the receiver is further configured to receive the coil signals from at least one from among the first coil and the second coil based on a control of the controller.

12. The apparatus of claim 11, wherein at least one from among the first region and the second region comprises a region of interest (ROI) to be scanned,
    the controller is further configured to enable at least one from among the first MR signal channels and the second MR signal channels that is allocated to the ROI, and
    the image processor is further configured to acquire the image of the ROI.

13. The apparatus of claim 12, wherein the image processor is further configured to acquire the image of the ROI by combining the coil signals.

14. The apparatus of claim 9, wherein the receiver is included in the table on which the object is to be positioned.

15. A magnetic resonance imaging (MRI) method comprising:
    dividing, by a processor, a patient support table into regions;
    allocating, by the processor, MR signal channels to the regions;
    determining, by the processor, coils to be used for imaging the regions, the determined coils of each of the regions outputting coil signals acquired from an object disposed on the patient support table, through the MR signal channels connected to the determined coils, respectively;

grouping, by the processor, the MR signal channels associated with at least one of the determined coils by using switching devices, wherein each of the switching devices comprises one output channel and input channels, and each of the input channels is selectively connectable to the one output channel;

receiving, by a receiver, the coil signals, which are input through the MR signal channels connected to the input channels of the grouped switching devices and output from the one output channel of each of the grouped switching devices; and reconstructing, by an image processor, an MR image of a region of interest (ROI) of the object, from the coil signals received via the one output channel of each of the grouped switching devices, wherein each of the switching devices comprises a plurality of input units corresponding to the input channels and one common output terminal corresponding to the one output channel, each of the switching devices has a construction in which the one common output terminal is connected to one input unit at a time, among the plurality of input units, thereby connecting the one output channel to one of the input channels, the switching devices comprise a first switching device having a first plurality of input channels, as the input channels, and a second switching device having a second plurality of input channels, as the input channels, the at least one of the determined coils comprises a first coil to be used for a first region, among the regions, and a second coil to be used for a second region, among the regions, the MR signal channels of the first coil comprise first MR signal channels connected to a first input channel of the first plurality of input channels and a first input channel of the second plurality of input channels, respectively, and the MR signal channels of the second coil comprise second MR signal channels connected to a second input channel of the first plurality of input channels and a second input channel of the second plurality of input channels, respectively.

16. The MRI method of claim 15, wherein the patient support table comprises coil connectors and the determining the coils comprises:

identifying the coil connectors in correspondence to the first region and the second region; and identifying the first coil and the second coil connected to the coil connectors, for the first region and the second region, respectively.

17. The MRI method of claim 16, wherein at least one from among the first region and the second region comprises the ROI, and the receiving the coil signals comprises:

enabling at least one from among the first MR signal channels and the second MR signal channels that is associated with the ROI via at least one from among the first switching device and the second switching device, respectively; and receiving the coil signals from at least one from among the first coil and the second coil that is identified as being connected to the coil connectors corresponding to the ROI.

* * * * *